United States Patent
Pfeuffer et al.

(10) Patent No.: US 10,361,249 B2
(45) Date of Patent: Jul. 23, 2019

(54) DISPLAY DEVICE HAVING A PLURALITY OF PIXELS THAT CAN BE OPERATED SEPARATELY FROM ONE ANOTHER

(71) Applicant: OSRAM Opto Semiconductors GmbH, Regensburg (DE)

(72) Inventors: Alexander F. Pfeuffer, Regensburg (DE); Dominik Scholz, Bad Abbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/578,239

(22) PCT Filed: May 11, 2016

(86) PCT No.: PCT/EP2016/060554
§ 371 (c)(1),
(2) Date: Nov. 29, 2017

(87) PCT Pub. No.: WO2016/192939
PCT Pub. Date: Dec. 8, 2016

(65) Prior Publication Data
US 2018/0166499 A1    Jun. 14, 2018

(30) Foreign Application Priority Data
May 29, 2015  (DE) ......................... 10 2015 108 532

(51) Int. Cl.
*H01L 33/38*  (2010.01)
*H01L 27/15*  (2006.01)
(Continued)

(52) U.S. Cl.
CPC .......... *H01L 27/156* (2013.01); *H01L 33/382* (2013.01); *H01L 33/24* (2013.01); *H01L 33/62* (2013.01)

(58) Field of Classification Search
CPC . H01L 27/3281; H01L 27/32; H01L 27/3244; H01L 27/156; H01L 33/382; H01L 33/24; H01L 33/62
See application file for complete search history.

(56) References Cited

U.S. PATENT DOCUMENTS 9,362,335 B2   6/2016  von Malm
9,748,309 B2   8/2017  von Malm
(Continued)

FOREIGN PATENT DOCUMENTS

DE   102011056888 A1   6/2013
DE   102012110775 A1   5/2014
(Continued)

OTHER PUBLICATIONS

Herrnsdorf et al. Actyive Matrix GaN Micro Light-Emitting Diode Display With Unpreccedented Brightness. IEEE Transactions on Electronic Devices, vol. 62, No. , Jun. 2015, pp. 1918-1921.*
(Continued)

*Primary Examiner* — Galina G Yushina
(74) *Attorney, Agent, or Firm* — Slater Matsil, LLP (57) ABSTRACT

A display device having a plurality of pixels is disclosed. In an embodiment the display includes a semiconductor layer sequence and a first contact structure for contacting a first semiconductor layer and a second contact structure for contacting a second semiconductor layer, wherein the first contact structure has first contacts configured to be operated separately from one another, each first contact extending laterally and uninterrupted along the first semiconductor layer within an associated pixel and each first contact delimits the pixel in a lateral manner with its contour, wherein the semiconductor layer sequence and the first contact structure have at least one recess laterally bordering a respective pixel, which recess extends through the first contact structure, the first semiconductor layer and the active
(Continued)

layer into the second semiconductor layer, and wherein the second contact structure has second contacts extending through the at least one recess.

8 Claims, 5 Drawing Sheets

(51) Int. Cl.
*H01L 33/62* (2010.01)
*H01L 33/24* (2010.01)

(56) References Cited

U.S. PATENT DOCUMENTS

| | | | |
|---|---|---|---|
| 9,917,077 B2 | 3/2018 | von Malm et al. | |
| 2012/0049232 A1* | 3/2012 | Okabe | H01L 33/38 257/98 |
| 2014/0014894 A1 | 1/2014 | Mohammed et al. | |
| 2014/0034949 A1* | 2/2014 | Matsukura | H01L 29/78693 257/52 |
| 2015/0001530 A1 | 1/2015 | Ishiga et al. | |
| 2015/0014716 A1* | 1/2015 | von Malm | H01L 27/156 257/89 |
| 2015/0325598 A1 | 11/2015 | Pfeuffer et al. | |

FOREIGN PATENT DOCUMENTS

| | | |
|---|---|---|
| DE | 102012112302 A1 | 6/2014 |
| JP | 2015501085 A | 1/2015 |
| WO | 2010014032 A1 | 2/2010 |
| WO | 2014139849 A1 | 9/2014 |

OTHER PUBLICATIONS

Herrnsdorf, J. et al., "Active-Matrix GaN Micro Light-Emitting Diode Display with Unprecendented Brightness," IEEE Transactions on Electron Devices, vol. 62, No. 6, Jun. 2015, 8 pages.

Liu, Z.J. et al., "Investigation of Forward Voltage Uniformity in Monolithic Light-Emitting Diode Arrays," IEEE Photonics Technology Letters, vol. 25, No. 13, Jul. 1, 2013, 4 pages.

* cited by examiner

DISPLAY DEVICE HAVING A PLURALITY OF PIXELS THAT CAN BE OPERATED SEPARATELY FROM ONE ANOTHER

This patent application is a national phase filing under section 371 of PCT/EP2016/060554, filed May 11, 2016, which claims the priority of German patent application 10 2015 108 532.1, filed May 29, 2015, each of which is incorporated herein by reference in its entirety.

TECHNICAL FIELD

A display device is specified.

SUMMARY OF THE INVENTION

Embodiments provide a display device permitting a particularly reliable, efficient operation of the display device.

A display device is specified. In various embodiments, the display device comprises a plurality of pixels that can be operated separately from one another, which comprises a semiconductor layer sequence for generating electromagnetic radiation. The semiconductor layer sequence has, for example, a first semiconductor layer, an active layer and a second semiconductor layer. The display device can be a light-emitting diode, for example, in particular a thin-film light-emitting diode, which is free of a growth substrate for the semiconductor layer sequence.

The display device extends in a vertical direction between a first main plane and a second main plane, wherein the vertical direction can run transversely or perpendicular to the first and/or second main plane. The main planes can be the main extension planes on the top surface and the bottom surface of the display device, for example. The display device is extended two-dimensionally in a lateral direction, thus parallel to the main planes at least in places, for example, and has a thickness in a vertical direction that is small relative to a maximum extension of the display device in a lateral direction.

For example, the semiconductor layer sequence, in particular the active layer, contains a III-V compound semiconductor material. III-V compound semiconductor materials are particularly suitable for generating radiation in the ultraviolet ($Al_x In_y Ga_{1-x-y} N$) via the visible spectral range ($Al_x In_y Ga_{1-x-y} N$ in particular for blue to green radiation, or $Al_x In_y Ga_{1-x-y} P$, in particular for yellow to red radiation) up to the infrared ($Al_x In_y Ga_{1-x-y} As$) spectral range. Here $1 \leq x \leq 1$, $0 \leq y \leq 1$ and $x+y \leq 1$, in particular with $x \neq 1$, $y \neq 1$, $x \neq 0$ and/or $y \neq 0$ applies respectively. Using III-V compound semiconductor materials, in particular from said material systems, high internal quantum efficiencies can be achieved in radiation generation, furthermore.

The active layer is arranged between the first semiconductor layer and the second semiconductor layer. The first semiconductor layer and the second semiconductor layer expediently have conductor types that differ from one another. In particular, the first semiconductor layer can be a p-doped semiconductor layer and the second semiconductor layer can be an n-doped semiconductor layer.

In the manufacture of the display device the pixels preferably arise from a common semiconductor layer sequence. The semiconductor layers associated with a particular pixel, thus a lateral region of the semiconductor layer sequence that forms the pixel, can be identical with regard to their material composition and their layer thicknesses to semiconductor layers that are associated with another pixel of the display device, apart from variations caused by manufacturing.

The display device has a carrier, for example. The carrier can have a plurality of switches, for example, which to control at least one pixel are associated respectively with the particular pixel. The carrier can stabilize the semiconductor layer sequence mechanically, for example.

The first main plane is located on the side of the semiconductor layer sequence remote from the carrier, for example. The second main plane is accordingly located on the side of the carrier remote from the semiconductor layer sequence, for example.

In at least one embodiment, the display device comprises a first contact structure for contacting the first semiconductor layer. The display device further comprises a second contact structure for contacting the second semiconductor layer.

The first contact structure is arranged, for example, between the semiconductor layer sequence and the carrier. The first contact structure is connected in particular electrically conductively to the first semiconductor layer. The first semiconductor layer is electrically contactable from the second main plane by means of the first contact structure.

The first contact structure consists, for example, of a metallic layer or a metallic layer stack. The first contact structure preferably has an optical mirror effect. For example, the first contact structure consists of a material such as Al, Ag, Au, or Rh, or has such a material. In particular, a layer thickness of the first contact structure is between 50 nm and 500 nm.

In addition or alternatively, a transparent conductive oxide (TCO) layer is introduced between the semiconductor layer sequence and the metallic layer or the metallic layer stack. This consists, as an example, of a material such as ITO, SnO, ZnO, or has such a material. In particular, a layer thickness of such a layer is smaller than 100 nm.

In addition, a dielectric or a dielectric layer stack can be arranged between the transparent conductive oxide layer and the metallic layer or the metallic layer stack. This consists as an example of $SiO_2$ or has $SiO_2$. In particular, a layer thickness of this is between 100 nm and 1000 nm. The dielectric or the dielectric layer stack can have recesses, for example, in particular singulated. Thus an electrically conductive connection is provided between the transparent conductive oxide layer and the metallic layer or the metallic layer stack.

The second contact structure is likewise arranged between the carrier and the semiconductor layer sequence, for example. The second contact structure is connected in particular electrically conductively to the second semiconductor layer. The second semiconductor layer is electrically contactable from the second main plane by means of the second contact structure.

The first contact structure and/or the second contact structure or at least a partial layer thereof are formed reflective, for example, in particular with regard to the radiation generated during operation of the display device.

In at least one embodiment, the first contact structure has first contacts that can be operated separately from one another. The first contacts each extend laterally and uninterrupted along the first semiconductor layer within an associated pixel. The first contacts each delimit a pixel laterally with their contour.

A switch for controlling at least one pixel can be associated respectively with the first contacts in this context, for example. In particular, the first contacts are connected electrically to the respective switch. The first contacts contact the first semiconductor layer separately from one another electrically in each case. In a plan view of the display device in a vertical direction, the lateral contour of each of the first contacts respectively delimits a pixel. In other words, a lateral extension of a pixel is formed by a lateral extension of a respective first contact. The first contacts are associated in particular, especially unambiguously associated, with one pixel respectively for controlling the pixel.

In at least one embodiment, the semiconductor layer sequence and the first contact structure have at least one recess laterally bordering a respective pixel. The at least one recess extends through the first contact structure, the first semiconductor layer and the active layer, and into the second semiconductor layer.

In particular, the at least one recess extends from the second main plane transversely or perpendicular to the first main plane. The at least one recess interrupts in particular the first contact structure. For example, laterally consecutive first contacts are respectively separated from one another electrically by the at least one recess. The at least one recess extends in a lateral direction in particular in a region of an optical separation between the individual pixels in a plan view of the display device. The optical separation is in particular a lateral separation of the individual pixels, which separation can be perceived directly by an observer in a plan view of the display device, for example, and/or can be measured by suitable enlargement and/or can be perceived at least indirectly by the observer in a plan view, for example, in the form of an enhanced impression of sharpness.

In at least one embodiment, the second contact structure has second contacts. The second contacts extend from a side of the semiconductor layer sequence facing the first contact structure through the at least one recess.

The second contacts contact the second semiconductor layer respectively electrically. In this case the second contacts can be connected electrically to one another in particular in the form of a common electrode of the display device.

The second contacts are electrically insulated in particular from the first semiconductor layer. In this context the display device can have a separating structure, which separates the second contacts electrically from the first contacts and/or the first semiconductor layer. For example, the separating structure delimits the at least one recess laterally for this purpose. For example, the second contacts completely fill the at least one recess laterally delimited by the separating structure. Alternatively to this, the second contacts cover the separating structure and the second semiconductor layer on an end face of the at least one recess, thus in particular do not completely fill the respective recess.

A contacting of the second semiconductor layer by the second contacts extends in particular in the region of the optical separation between the individual pixels in a plan view of the display device. The optical separation between the pixels can thus be combined in particular with the contacting of the second semiconductor layer. For example, the separating structure can be constructed reflectively in this context, in particular with regard to the radiation generated during the operation of the display device. The separating structure consists, for example, of a partially or completely transparent dielectric, for example, of silicon oxide and/or silicon nitride and/or aluminum oxide. For example, a reflection can thus take place dependent on the angle in the form of total reflection on the dielectric, or on the metal layer of the second contact structure lying behind with regard to a beam path of the radiation generated during operation. The second contact structure is advantageously constructed for this purpose from a highly reflective material such as silver, for example.

In at least one embodiment, the display device with a plurality of pixels that can be operated separately from one another comprises a semiconductor layer sequence for generating electromagnetic radiation. The semiconductor layer sequence has a first semiconductor layer, an active layer and a second semiconductor layer.

The display device further comprises a first contact structure for contacting the first semiconductor layer and a second contact structure for contacting the second semiconductor layer. The first contact structure has first contacts that can be operated separately from one another and each extend laterally and uninterrupted along the first semiconductor layer within an associated pixel. The first contacts each delimit a pixel laterally with their contour.

The semiconductor layer sequence and the first contact structure have at least one recess laterally bordering a respective pixel, which recess extends through the first contact structure, the first semiconductor layer and the active layer, and into the second semiconductor layer. The second contact structure has second contacts, which extend from a side of the semiconductor layer sequence facing the first contact structure through the at least one recess.

This facilitates a particularly advantageous lateral space utilization of the display device, in which a separating trench between the individual pixels of the first contact structure and the first semiconductor layer is used as through-contacting of the second semiconductor layer. A ratio of radiating surface of the display device to non-radiating surface can thus be kept particularly high, thus contributing to a high efficiency of the display device. Furthermore, due to contacting in a lateral edge region with regard to the individual pixels, an uninterrupted illumination pattern of the respective pixels is facilitated. In particular, a place within a pixel that is darkly perceptible due to contacting can be avoided in this case. Furthermore, a redundant contacting of the pixels is facilitated, thus contributing to a reliability of the display device.

In at least one embodiment, the first and second contacts are each in direct contact with the first and second semiconductor layers. The first and second contacts contact the respective semiconductor layers electrically, in particular directly. For example, the first contacts and the first semiconductor layer directly border one another laterally two-dimensionally. The second contacts extend through a respective recess into the second semiconductor layer, for example.

In at least one embodiment, several second contacts are associated with at least one pixel, which contacts contact the respective pixel redundantly. In particular, the several second contacts border the at least one pixel laterally. Operation of the at least one pixel takes place by energization of the semiconductor layer sequence via the several second contacts associated with the pixel and the respective first contact.

By arranging the second contacts in a lateral edge region of the pixels, several redundant second contacts can be associated with a single pixel. A failure of one of the several second contacts can thus be compensated for in a particularly simple manner. This contributes to a high yield in manufacturing of the display device and its high failure safety.

In at least one embodiment, at least one of the second contacts is arranged bordering several adjacent pixels in a lateral manner and is constructed to contact the several adjacent pixels. In other words, the at least one second contact is associated respectively with the several adjacent pixels. Thus several pixels can be operated in an advantageous manner by means of a single contact. A space requirement for contacting of the pixels can thus be kept small, contributing to a high ratio of radiating surface of the display device to non-radiating surface.

In at least one embodiment, the pixels are arranged separated laterally in the form of a lattice. The pixels are arranged in this case in lines and columns arranged transversely or perpendicular to these, for example, wherein the lines and columns are respectively separated by separating webs. The separating webs of the lateral separation run in this case likewise along the lines and columns arranged transversely or perpendicular to these. The lateral separation forms a lattice, which encloses lattice points or nodal points of the lattice at intersection points of the separating webs, for example. In other words, the pixels are arranged with regard to the lattice in particular in interstices of the lattice formed by the separating webs. This means that the pixels are arranged optically separated in a plan view of the display device. At every nodal point of the lattice one of the second contacts is arranged.

For example, the pixels can be arranged separately in the manner of a regular polygonal lattice. A lateral separation of the pixels does not necessarily have to take place along straight lines in this case. In fact, even pixels with sides that are curved or kinked, at least in areas, can be created by the lateral separation. For example, the pixels can be perceived as circular dots. An activation of pixels arranged separately in the form of a lattice is simplified in an advantageous manner. Furthermore, a representation of shapes, figures or characters can take place precisely and flexibly by the display device.

In at least one embodiment, at every nodal point of the lattice one of the second contacts is arranged. The respective second contact is thus advantageously arranged in an optical separating web between the pixels, so that a radiating surface of the display device can be kept uninterrupted and of maximal size. In particular, the respective second contact can border several pixels laterally, for example, four pixels in a regular rectangular lattice, in an arrangement corresponding to a nodal point of the lattice. This makes it possible to operate a particularly high number of adjacent pixels using just the one particular second contact.

In at least one embodiment, a second contact is arranged respectively between two adjacent nodal points with regard to a respective column and/or with regard to a respective line. Thus the respective second contact is associated with two pixels in each case, for example.

In at least one embodiment, one of the second contacts is arranged on every second laterally consecutive nodal point of the lattice. The display device can thus be operated advantageously free of redundant second contacts, so that a particularly high surface utilization of the display device is facilitated. Deviating from this it is likewise conceivable for one of the second contacts to be arranged on every xth laterally consecutive nodal point of the lattice, wherein x can be any natural number. In other words, even fractions of the nodal points that are different from 1 and 0.5 can be occupied by second contacts.

In at least one embodiment, at least one of the second contacts, which is associated with a pixel that borders a lateral edge region of the display device, is constructed extending parallel along the edge region. This contributes to a uniform contour of the display device and process reliability in manufacture of the display device. For example, mechanical weak points of the display device, in particular with regard to a singulation process, can be avoided. As an example, the respective second contact ends flush with the lateral edge region of the display device in such a manner that, in a transition area around the particular second contact along an edge of the display device, a substantially flat surface arises, in which the structure of the respective second contact does not stand out. Deviating from this, the particular second contact is arranged at least in such a manner that at least one edge-free surface is created in said transition area.

In at least one embodiment, a lateral extension of second contacts associated with a pixel is dependent in each case on a number of second contacts associated with the respective pixel. The lateral extension of the second contacts can vary both in form and size in this case. In particular, a second contact associated with a particular pixel borders the particular pixel in a lateral manner. Operation of the particular pixel takes place by an energization via the second contacts associated with the pixel and the respective first contact.

An adaptation of the lateral extension of the second contacts facilitates a particularly uniform illumination pattern of the display device. For example, a brightness of the individual pixels is influenced by a current flow through the respectively associated first and second contacts. The current flow through the contacts is in particular a function of a cross-sectional area of the respective contacts.

As an example, a number of second contacts associated with a pixel can be reduced compared with other pixels of the display device, so that by simultaneous enlargement of the second contacts associated with the pixel compared with the second contacts associated with other pixels of the display device, a cumulative current flow for operating the pixels is substantially equal, and a uniform brightness of the pixels is achieved.

In at least one embodiment, at least one of the second contacts associated with a pixel that borders a lateral edge region of the display device has a predetermined spacing with which the respective second contact is arranged offset to a lateral interior of the display device. For example, the respective second contact is arranged laterally offset to the interior of the display device in such a way that the respective second contact ends flush with the edge, or at least a lateral projection of the respective second contact with regard to the transition area around the respective second contact along the edge of the display device is reduced or avoided. The respective second contact can be arranged in this case on the aforesaid lattice, for example, but laterally offset with regard to a nodal point of the lattice. This contributes advantageously to a high process reliability in manufacture of the display device.

In at least one embodiment, a lateral extension of at least one of the second contacts is constructed to be circular. A particularly uniform energization of the pixels associated with the at least one circularly constructed second contact is thus advantageously facilitated.

In at least one embodiment, the lateral extension of a respective second contact can vary in a vertical direction. In particular, the respective second contact and/or the respective recess can be constructed conical or in the shape of a cone. For example, the lateral extension of the respective recess and/or of the respective second contact is enlarged towards the second main plane. A lateral delimitation of a pixel associated with the respective second contact is then funnel-shaped, for example, contributing to a particularly advantageous radiation characteristic of radiation generated in the region of the respective pixel.

In at least one embodiment, at least one of the second contacts encloses a pixel laterally. A particularly uniform current flow is advantageously facilitated to the laterally enclosed pixel. This contributes to uniformly generated radiation in the area of the pixel, in particular with regard to a perceptible brightness of the pixel.

In at least one embodiment, the second contact structure is constructed in the form of a lattice. This advantageously permits a particularly simple, redundant contacting as well as a uniform energization of the pixels.

BRIEF DESCRIPTION OF THE DRAWINGS

Further features, configurations and expediencies result from the following description of the exemplary embodiments in connection with the figures.

These show.

Identical and similar elements or elements with the same effect are provided with the same reference signs in the figures. The figures and the size ratios of the elements shown in the figures in relation to one another should not be regarded as being to scale. In fact, individual elements and in particular layer thicknesses can be shown exaggeratedly large for better representation and/or for a better understanding.

DETAILED DESCRIPTION OF ILLUSTRATIVE EMBODIMENTS

Figure 1:
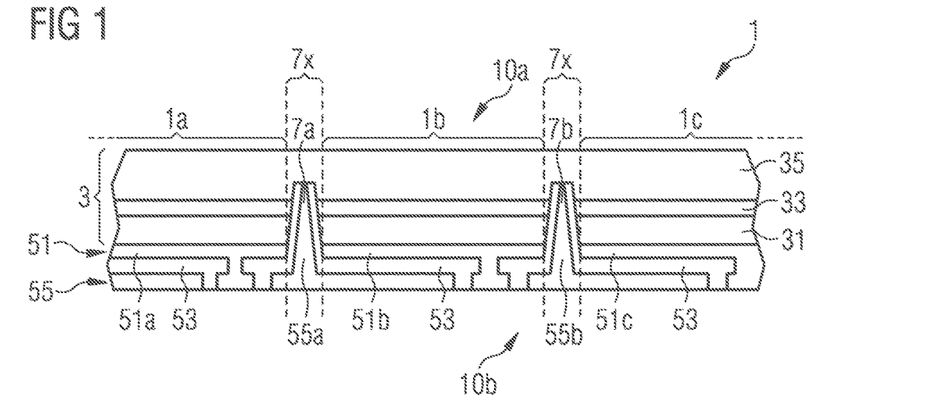
FIG. 1 is a first exemplary embodiment of a display device with a plurality of pixels that can be operated separately from one another in a schematically represented lateral sectional view.

A first exemplary embodiment of a display device 1 with a plurality of pixels 1a, 1b, 1c that can be operated separately from one another is shown in FIG. 1. The display device 1 extends in a lateral direction beyond the section shown, for example, as indicated by the dashed lines of the pixels 1a, 1c.

The display device 1 comprises a semiconductor layer sequence 3, which has a first semiconductor layer 31, an active layer 33 provided to generate radiation and a second semiconductor layer 35. The display device 1 extends in a vertical direction between a first main plane 10a and a second main plane 10b. The first main plane 10a can in particular form a radiation exit surface of the display device 1.

The active layer 33 is arranged here between the first semiconductor layer 31 and the second semiconductor layer 35, wherein the two semiconductor layers 31, 35 are of a different conduction type. The first semiconductor layer 31 is in particular constructed to be p-conductive and the second semiconductor layer 35 is constructed to be n-conductive.

Extending directly adjacent two-dimensionally to the first semiconductor layer 31 is a first contact structure 51, which facilitates an electrical contacting of the first semiconductor layer 31. The first contact structure 51 is interrupted here by a plurality of recesses 7a, 7b, extending vertically through the display device 1. In particular, the first contact structure 51 is divided into a plurality of first contacts 51a, 51b, 51c, which are separated electrically from one another. A lateral extension of the first contacts 51a, 51b, 51c corresponds to a lateral extension of the pixels 1a, 1b, 1c.

The first contacts 51a, 51b, 51c contact the first semiconductor layer 31 electrically from the second main plane 10b of the display device 1 and facilitate an energization of the pixels 1a, 1b, 1c separately from one another. In other words, one of the first contacts 51a, 51b, 51c is associated with one of the pixels 1a, 1b, 1c respectively for the separate operation of the respective pixel 1a, 1b, 1c.

The recesses 7a, 7b are arranged here in a region of a respective optical separating web 7x between the pixels 1a, 1b, 1c, in particular inside the separating webs 7x. The first contacts 51a, 51b, 51c associated with a respective pixel 1a, 1b, 1c are thus constructed two-dimensionally and uninterrupted.

The recesses 7a, 7b extend in the vertical direction from the first contact structure 51 further through the first semiconductor layer 31 and the active layer 33. As shown in FIG. 1, the recesses 7a, 7b can extend further into the second semiconductor layer 35. The recesses 7a, 7b are delimited here by an electrically insulating separating structure 53 laterally to the semiconductor layer sequence 3 and the first contact structure 51. The separating structure 53 extends further in a lateral direction on a side facing the second main plane 10b along the first contact structure 51.

A second contact structure 55 likewise extends in a lateral direction on a side facing the second main plane 10b along the separating structure 53. The second contact structure 55 is separated electrically from the first contact structure 51 here by the separating structure 53, for example. The second contact structure 55 forms second contacts 55a, 55b here, which extend into the recesses 7a, 7b towards the second semiconductor layer 35.

The second contacts 55a, 55b contact the second semiconductor layer 35 electrically from the second main plane 10b of the display device 1 and facilitate an energization of the pixels 1a, 1b, 1c. The second contacts 55a, 55b can in particular be connected electrically to one another here. For example, the second contact structure 55 then forms a common electrode of the pixels 1a, 1b, 1c of the display device 1.

One of the second contacts 55a, 55b can be associated respectively with one of the pixels 1a, 1b, 1c for operation of the respective pixel 1a, 1b, 1c. Furthermore, one of the second contacts 55a, 55b can also be associated with more than one of the pixels 1a, 1b, 1c for operation of the respective pixels 1a, 1b, 1c. Furthermore, more than one of the second contacts 55a, 55b can be associated with one and/or more than one of the pixels 1a, 1b, 1c respectively for operation of the respective pixel 1a, 1b, 1c or the respective pixels 1a, 1b, 1c. Deviating from the lateral sectional view shown in FIG. 1, a separation of the second contact structure 55 by the separating structure 53 takes place in the paper plane, for example. In other lateral sections of the display device 1 perpendicular to the paper plane, the second contact structure 55 is connected continuously, for example. In other words, the lateral separation of the second contact structure 55 shown in FIG. 1 exists only in one region of the paper plane, for example, but in a plan view this point is not a separation, but only a local recess, which serves for a feedthrough of the respective contact 55a, 55b of the respective pixel 1a, 1b, 1c in the direction of a carrier.

Figure 2:
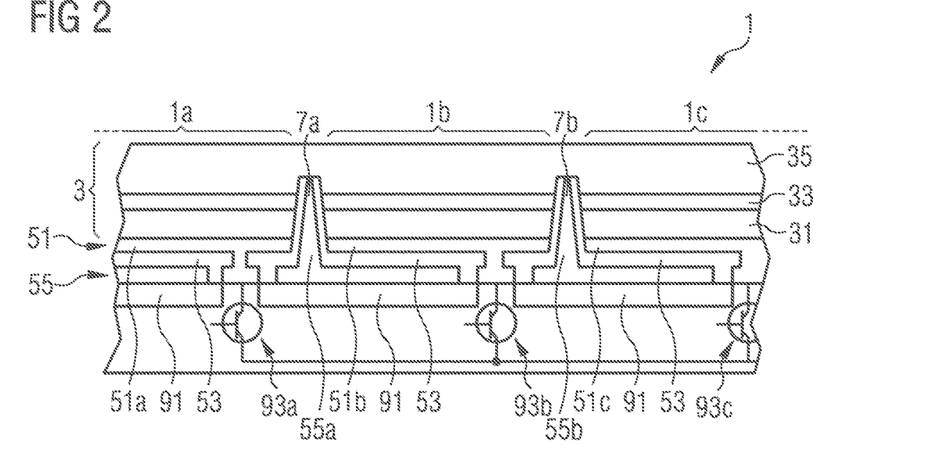
FIG. 2 is a second exemplary embodiment of the display device according to FIG. 1 in a schematically represented lateral sectional view.

A second exemplary embodiment of the display device 1 according to the first exemplary embodiment is shown in FIG. 2. In contrast to the first exemplary embodiment, the display device 1 has a carrier 9 in addition. The carrier 9 can serve for mechanical stabilization of the display device 1, for example. Alternatively or in addition, the carrier 9 can serve for electrical contacting of the display device 1.

For example, the carrier 9 comprises for this purpose a further separating structure 91, which separates the first contact structure 51 and second contact structure 55 electrically from one another. The carrier further comprises switches 93a, 93b, 93c, which can be operated separately from one another and are each connected electrically to one of the first contacts 51a, 51b, 51c.

With reference to FIGS. 3 to 10 a third to tenth exemplary embodiment of the display device 1 according to one of the previous exemplary embodiments are shown in a schematic plan view. For a simplified representation, several vertical section planes in the paper plane are shown. In particular, an arrangement of the first contact structure 51 and second contact structure 55 is shown, wherein a number, shape, size and position of the first contacts 51a, 51b, 51c and the second contacts 55a, 55b can differ in the following exemplary embodiments.

In the third exemplary embodiment (compare FIG. 3) the pixels 1a, 1b, 1c are arranged separated from one another in the form of a lattice. The pixels 1a, 1b, 1c correspond here in their lateral extension substantially to the first contacts 51a, 51b, 51c. The lattice 100 is a uniform lattice, for example, in particular a uniform rectangular lattice.

Figure 3:
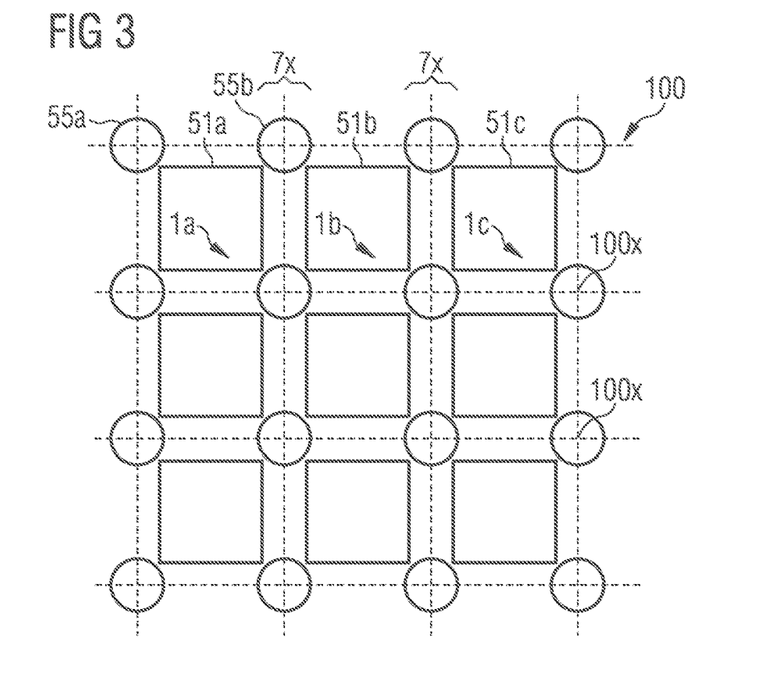
FIGS. 3 to 10 are exemplary embodiments of the display device according to FIG. 1 in a schematically represented plan view.
Figure 4:
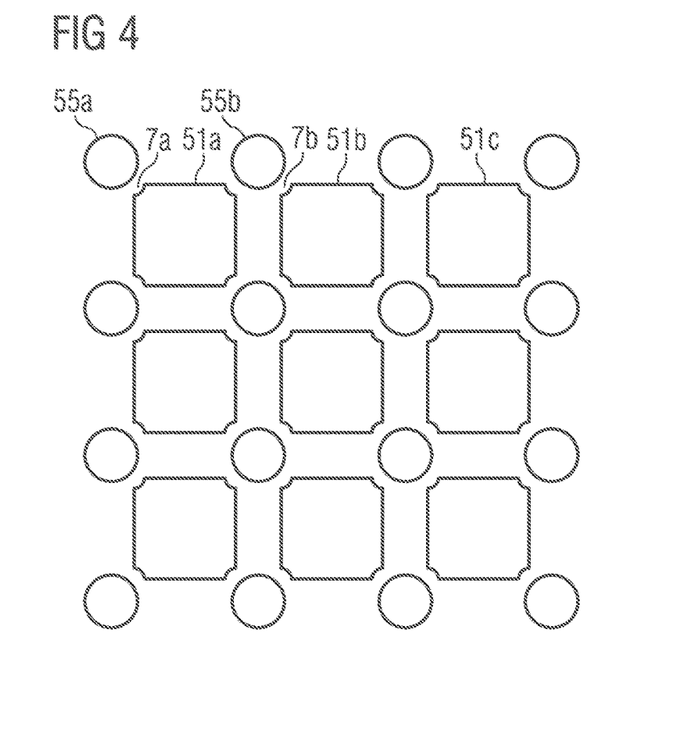

The lattice comprises nodal points 100x, in which a column and a line of the lattice 100 respectively intersect. The lines and columns of the lattice here form in particular the optical separating webs 7x between the individual pixels 1a, 1b, 1c. Arranged on the nodal points 100x in each case is one of the second contacts 55a, 55b. To operate a respective pixel 1a, 1b, 1c, four adjacent second contacts 55a, 55b are associated with each pixel 1a, 1b, 1c, which contacts permit a redundant energization of the second semiconductor layer 35 (compare FIG. 1) in the region of the respective pixel 1a, 1b, 1c. The energization takes place with regard to the respective pixel 1a, 1b, 1c uniformly from all four sides, so that a uniform luminance distribution of the pixels 1a, 1b, 1c is facilitated.

One of the second contacts 55a, 55b in each case is also associated with four adjacent pixels 1a, 1b, 1c, so that in spite of redundant energization of the second semiconductor layer 35 in the region of the respective pixels 1a, 1b, 1c, no additional second contacts 55a, 55b may be required. A lateral space requirement of the second contacts 55a, 55b is thus advantageously kept small. By arranging the second contacts 55a, 55b in the region of the optical separating webs 7x between the pixels 1a, 1b, 1c, a contribution is also made to a particularly high radiating surface of the display device 1.

The first contacts 51a, 51b, 51c are constructed to be reflective, for example. The first contacts 51a, 51b, 51c can then also be described as "contact mirrors" or "mirror surface". In this exemplary embodiment, the first contacts 51a, 51b, 51c are constructed to be rectangular, for example.

The second contacts 55a, 55b are constructed to be circular in lateral extension, for example, so that the second semiconductor layer 35 is energized uniformly in the region of the respectively adjacent pixels 1a, 1b, 1c.

In the fourth exemplary embodiment (compare FIG. 4) the pixels 1a, 1b, 1c are likewise arranged separated from one another in the form of a lattice. A lateral extension of the recesses 7a, 7b in the region of the first contacts 51a, 51b, 51c is dimensioned so large that a lateral extension of the first contacts 51a, 51b, 51c is reduced compared with the third exemplary embodiment. This permits a particularly large lateral extension of the second contacts 55a, 55b, so that a current density can be kept low during operation of the second contacts 55a, 55b. A loss of radiating surface due to the reduced lateral extension of the first contacts 55a, 55b is advantageously small in this case in comparison to a centrally arranged contacting of the second semiconductor layer 35 in relation to the respective pixels 1a, 1b, 1c. The first contacts 51a, 51b, 51c can have recesses at their lateral edge region in this context, in particular recesses in the shape of a segment of a circle.

Figure 5:
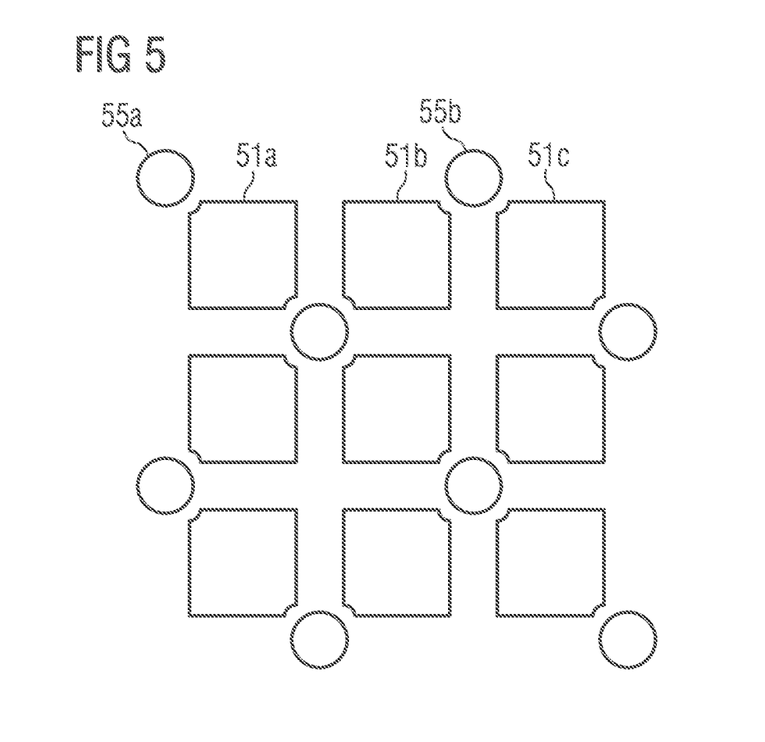
Figure 6:
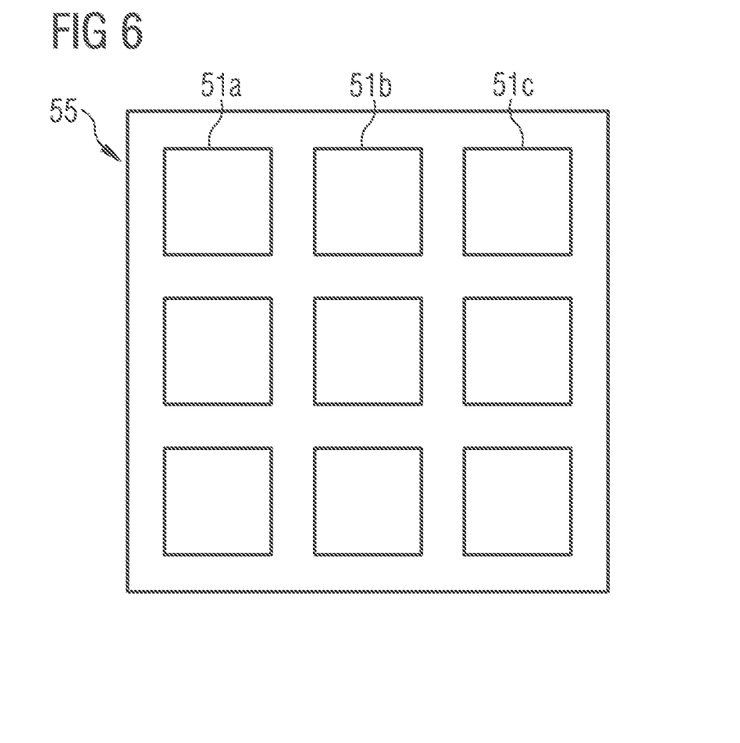
Figure 7:
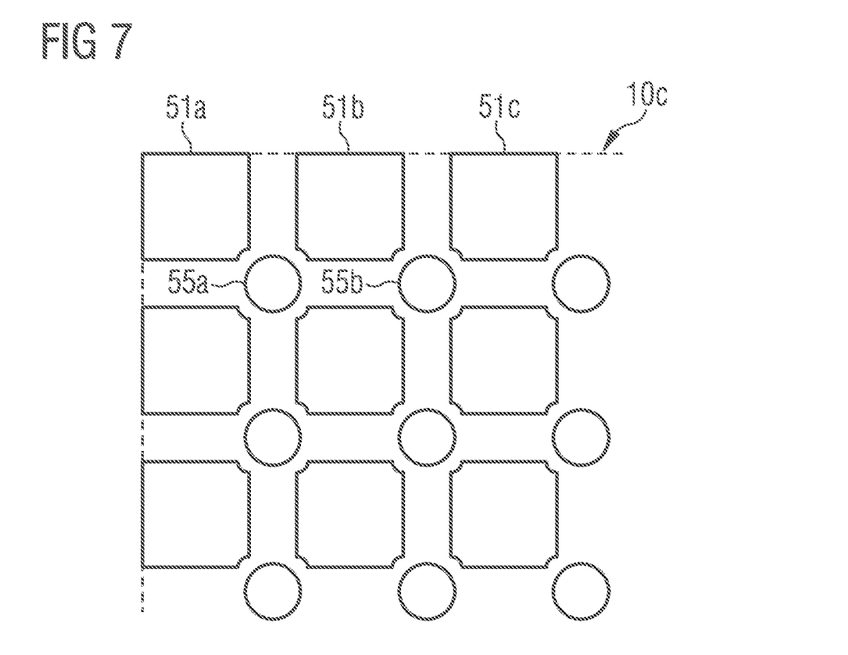
Figure 8:
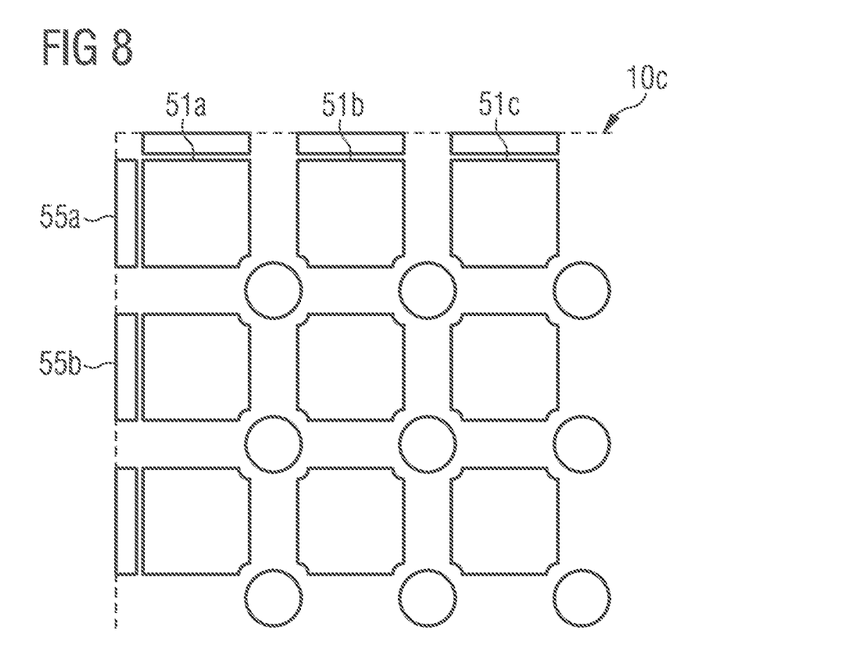
Figure 9:
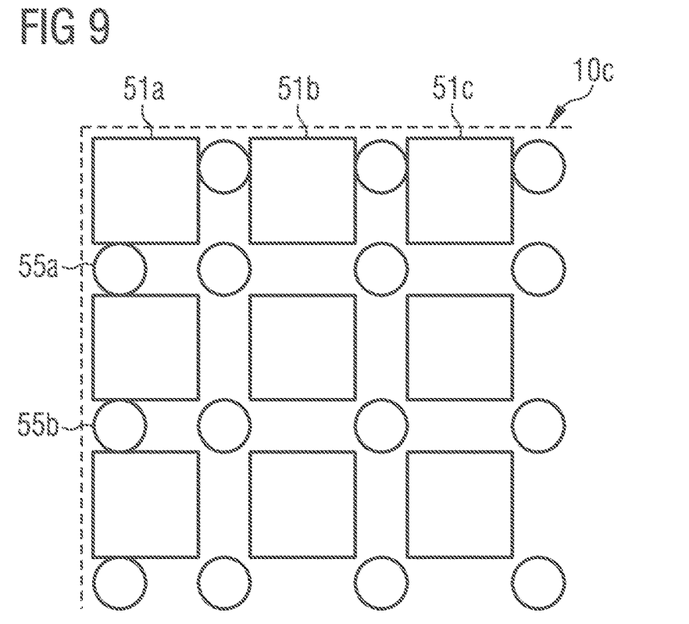
Figure 10:
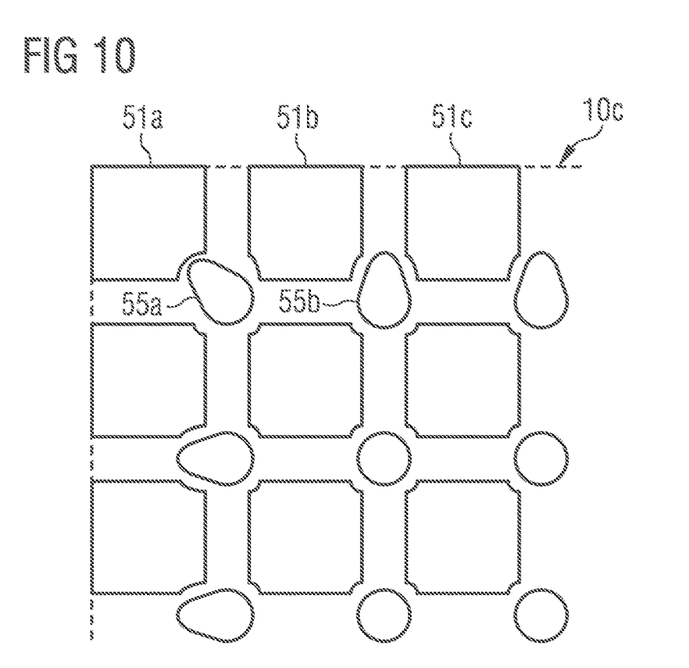

The fifth exemplary embodiment differs from the previous exemplary embodiments three and four due to a number of the second contacts 55a, 55b. In this exemplary embodiment only two second contacts 55a, 55b are associated with each pixel 1a, 1b, 1c. Deviating from this, a number of second contacts 55a, 55b associated with each pixel 1a, 1b, 1c can differ further. For example, only one second contact 55a, 55b could be associated with each pixel 1a, 1b, 1c. To this end a second contact 55a, 55b could be arranged only on a nodal point of every second line and every second column, for example. In the case of the respective first contacts 51a, 51b, 51c, which are associated with the nodal points 100x not occupied by second contacts 55a, 55b, the recesses in the shape of a segment of a circle (compare fourth exemplary embodiment) are advantageously eliminated, so that the emission surface associated with a respective pixel 1a, 1b, 1c is maximized.

In the sixth exemplary embodiment (compare FIG. 6), the recesses 7a, 7b form a common recess, for example, which extends continuously in the semiconductor layer sequence 3. By way of example this recess is etched into the semiconductor layer sequence 3. The second contacts 55a, 55b form in this recess a continuous second contact structure 55, for example, which laterally encloses the respective pixels 1a, 1b, 1c.

In the seventh exemplary embodiment (compare FIG. 7), a lateral edge region 10c of the display device 1 is shown. In contrast to the previous exemplary embodiments three to six, only two of the second contacts 55a, 55b are associated with the pixels 1a, 1b, 1c, which border the lateral edge region 10c, and only one of the second contacts 55a, 55b is associated in a lateral corner of the display device 1a. Due to a mechanical sensitivity of the second contacts 55a, 55b, this arrangement facilitates a simplified severing of the display device 1 in the edge region 10c with reduced failure risk.

In the eighth exemplary embodiment (compare FIG. 8), in contrast to the seventh exemplary embodiment, the second contacts 55a, 55b are constructed parallel to the lateral edge region 10c in the lateral edge region 10c of the display device 1. For example, the second contacts 55a, 55b can also form a continuous frame of the display device 1. This permits a simplified severing of the display device 1 in the edge region 10c as well as a uniform energization and homogeneous brightness even of the pixels 1a, 1b, 1c in the lateral edge region 10c.

In the ninth exemplary embodiment (compare FIG. 9), in contrast to the previous exemplary embodiments seven and eight, the second contacts 55a, 55b are arranged laterally offset to an interior of the display device 1 in the lateral edge region 10c of the display device 1. Failure safety in a separation process can thus advantageously be increased while maintaining the most homogeneous possible energization of the respective pixels 1a, 1b, 1c, for example, by removing the second contacts 55a, 55b from the separating edge.

In the tenth exemplary embodiment (compare FIG. 10), a shape and size of the lateral extension of the second contacts 55a, 55b, which are associated with the pixels 1a, 1b, 1c bordering the lateral edge region 10c, differ in contrast to the seventh exemplary embodiment. A lateral extension of the second contacts 55a, 55b is enlarged in particular towards the edge region 10c compared with the second contacts 55a, 55b in the lateral interior of the display device 1. A current density of the second contacts 55a, 55b as well as a cumulative current, which is supplied to the second semiconductor layer 35 in a region corresponding to a respective pixel 1a, 1b, 1c, is thus advantageously homogeneous.

The description made with reference to exemplary embodiments does not restrict the invention to these embodiments. Rather, the invention encompasses any novel feature and any combination of features, including in particular any combination of features in the Claims, even if this feature or this combination is not itself explicitly indicated in the Claims or exemplary embodiments.

The invention claimed is:

1. A display device with a plurality of pixels configured to be operated separately from one another, the display device comprising:
   a semiconductor layer sequence configured to generate electromagnetic radiation with a first semiconductor layer, an active layer and a second semiconductor layer; and
   a first contact structure contacting the first semiconductor layer and a second contact structure contacting the second semiconductor layer,
   wherein the first contact structure has first contacts configured to be operated separately from one another, each first contact extends laterally and uninterrupted along the first semiconductor layer within an associated pixel and each first contact delimits the pixel in a lateral manner with its contour,
   wherein the semiconductor layer sequence and the first contact structure have at least one recess laterally bordering a respective pixel, which recess extends through the first contact structure, the first semiconductor layer and the active layer into the second semiconductor layer,
   wherein the second contact structure has second contacts extending from a side of the semiconductor layer sequence facing the first contact structure through the at least one recess, and
   wherein the pixels are arranged separated and laterally grid-like, and the second contacts do not enclose the pixels laterally.

2. The display device according to claim 1, wherein the first contacts are in direct contact with the first semiconductor layer and the second contacts are each in direct contact with the second semiconductor layer.

3. The display device according to claim 1, wherein several second contacts are associated with at least one pixel and contact the respective pixel redundantly.

4. The display device according to claim 1, wherein at least one of the second contacts is arranged laterally bordering several adjacent pixels and is constructed for contacting of the several adjacent pixels.

5. The display device according to claim 1, wherein the pixels are arranged laterally separated from one another in form of a lattice, and wherein at least one of the second contacts is arranged on a nodal point of the lattice.

6. The display device according to claim 5, wherein at every nodal point of the lattice one of the second contacts is arranged.

7. The display device according to claim 1, wherein a lateral extension of a second contact associated with a pixel is respectively dependent on a number of second contacts associated with the respective pixel.

8. The display device according to claim 1, wherein a lateral extension of at least one of the second contacts is constructed to be circular.

* * * * *